US007732742B2

(12) United States Patent
Halahmi et al.

(10) Patent No.: US 7,732,742 B2
(45) Date of Patent: Jun. 8, 2010

(54) DEVICE AND METHOD FOR SIGNAL PROCESSING

(75) Inventors: Erez Halahmi, Bazra (IL); Gilad Diamant, Haifa (IL); Dimitry Shvarts, Kiryat Ono (IL); Ron Naaman, Rehovot (IL); Leeor Kronik, Rehovot (IL)

(73) Assignee: NovaTrans Group, SA, Vaumarcus NE (CH)

( * ) Notice: Subject to any disclaimer, the term of this patent is extended or adjusted under 35 U.S.C. 154(b) by 184 days.

(21) Appl. No.: 11/814,548

(22) PCT Filed: Jan. 22, 2006

(86) PCT No.: PCT/IL2006/000090

§ 371 (c)(1), (2), (4) Date: Jul. 23, 2007

(87) PCT Pub. No.: WO2006/077595

PCT Pub. Date: Jul. 27, 2006

(65) Prior Publication Data

US 2008/0150607 A1 Jun. 26, 2008

Related U.S. Application Data

(60) Provisional application No. 60/645,025, filed on Jan. 21, 2005.

(51) Int. Cl.
*G06G 7/16* (2006.01)
*H01L 31/0352* (2006.01)

(52) U.S. Cl. .............................. 250/207; 250/214 VT; 250/214 B; 378/87; 378/156

(58) Field of Classification Search ................ 250/207, 250/214 VT, 214 B; 378/87, 156
See application file for complete search history.

(56) References Cited

U.S. PATENT DOCUMENTS

| | | | | |
|---|---|---|---|---|
| 4,139,897 | A | 2/1979 | Gardner et al. | |
| 5,210,703 | A * | 5/1993 | Hodgson | 398/33 |
| 6,417,712 | B1 | 7/2002 | Beards et al. | |
| 6,950,495 | B2 * | 9/2005 | Nelson et al. | 378/87 |
| 2001/0003602 | A1 | 6/2001 | Fujita | |
| 2004/0095060 | A1 | 5/2004 | Ushifusa et al. | |
| 2004/0113544 | A1 | 6/2004 | Murakami et al. | |

* cited by examiner

*Primary Examiner*—Seung C Sohn
(74) *Attorney, Agent, or Firm*—Browdy and Neimark, PLLC

(57) ABSTRACT

An analog real-time signal processing device and method are presented. The device is configured to perform electrical signal processing. The device comprises an electronic circuit including at least one basic unit of electrodes, the basic unit being configured to be sensitive to an external field, such as input photon flux, indicative of a first input signal to cause emission of charged particles and configured to define at least one electrical input for a second input signal and one electrical output, thereby providing the electrical output in the form of an approximation of a product of the first and second input signals.

44 Claims, 9 Drawing Sheets

DEVICE AND METHOD FOR SIGNAL PROCESSING

FIELD OF THE INVENTION

This invention relates to a device and method for signal processing, such as signal transformation, correlation, etc.

BACKGROUND OF THE INVENTION

Most of the known techniques for mathematical transformation of functions (or signals) utilize digital signal processing. The main advantage of using digital signal processing is the flexibility to change the way the signal is processed at any time and very quickly; digital signal processors are relatively cheap and easy to use.

However, digital signal processors are practically incapable of concurrently performing several complicated mathematical operations. For example, Fourier transform, which is in principle very useful, is actually rarely used because of its significant resource consumption and low-speed operation. In reality, other "tricks" are used in order to avoid such transformation, thus getting a very similar result through far less operations (for example correlation with a few tones to find the amplitude only at these tones). However, there are cases when the Fourier transformation, or any other transformation aimed at the same purpose, is essential in its exact form.

U.S. Pat. No. 4,139,897 discloses a fast two dimensional Fourier transform device for deriving an electrical signal representative of a two dimensional Fourier transform of a two dimensional input image. According to this technique, two dimensional optical or electrical images are processed through a storage tube designed to yield the correlation function between the input images and stored images. By generating a series of stored images representing sine and cosine components of the Fourier transform, a fast two-dimensional transform of the image is obtained. This device operates as an analog correlator, with no requirement for sampling, digitizing, or recording the data outside the device.

SUMMARY OF THE INVENTION

There is a need in the art to facilitate signal processing, such as transformation or correlation, by providing a novel technique capable of performing analog real-time signal processing, which can be implemented in a low cost dedicated chip (or as part of another chip like DSP) and which can easily be integrated with other integrated devices.

The present invention solves the above problem by providing an analog real-time signal processing technique capable of carrying out mathematical transformation of functions (signals) by electrical means.

The device of the present invention includes an electrodes' arrangement utilizing one or more Photocathodes each associated with an Anode and a Gate, where the Photocathode is operated by a light signal (photon flux) indicative of a first input signal x(t), and the Gate is operated by a voltage which is modulated by a second electrical input signal V(t). An electric current, I(t), at the Anode may thus be an approximation for the product $x(t)\cdot V(t)$. The present invention thus provides for electrical real-time signal processing.

It should be understood that Photocathode actually presents an electrode emitting charged particles in response to an applied field. This may be photoemission, thermo-emission, etc. Although the invention is exemplified below with the use of Photocathode and electrons' emission, it is not limited to this specific example.

It should also be understood that the accuracy of the approximation depends on the linearity of the I-V curve resulting from the electrodes' arrangement (and possibly also of a light modulator as the case may be). The invention also provides for the device configuration aimed at improving the linearity.

It should also be understood that the device is associated with bias voltages and other generally known electrical connections, which need not be specifically described. For example, it will be appreciated by a person skilled in the art that the actual voltage signal considered in the product $x(t)\cdot V(t)$, is determined as $(V(t)-V_0(t))$, where $V_0(t)$ is the threshold voltage (the point where the IV-curve starts to rise).

It should also be understood that the technique of the present invention is not limited to a triode-based electrodes' arrangement, and more than three electrodes may be used in the basic unit(s) of the electrodes' arrangement. Generally speaking, the Photocathode-Anode-Gate unit of the present invention may be used in any device having at least one electrical input, one electrical output, and being light sensitive, such that the output is an approximation of the product of the input electrical signal (voltage or current applied to the Gate) and the input photon flux.

The term "electrodes' arrangement" used herein signifies an arrangement including a single basic unit or an array of such units, wherein the term "basic unit" refers to a structure including at least a source emitting charged particles (e.g. Photocathode), a target electrode (Anode) and a control electrode (Gate), so as to define at least one electrical input (Gate), one electrical output (Anode), and being sensitive to a field causing the emission (e.g. light sensitive), such that the output is an approximation of the product of the input electrical signal (voltage or current) and the input field (photon flux). Although in the description below the basic unit is referred to as "triode" or "transistor", it should be understood that the invention is not limited to these specific types of devices.

In some embodiments of the invention, the light signal indicative of the first input field (signal), x(t), is the input light signal x(t) directly applied to the Photocathode, for example in the case the signal is supplied from an optical fiber being the utility of an optical communication network. In another embodiments, the light signal indicative of the first input signal, x(t), is produced by modulating the operation of a light source with the input signal x(t), or by operating a light modulator at the output of a light source by this signal.

The Photocathode as well as Anode may be made of metal or semiconductor materials. The Photocathode is preferably a reduced work function electrode. Negative electron affinity (NEA) materials can be used (e.g., diamond), thus reducing the photon energy (exciting energy) necessary to induce photoemission in the Photocathode. Another way to reduce the work function is by coating or doping the Photocathode with an organic or inorganic material that reduces the work function. For example, this may be metal, multi-alkaline, bi-alkaline, or any NEA material, or GaAs electrode with cesium coating or doping thereby obtaining a work function of about 1-2 eV. The organic or inorganic coating also serves to protect the cathode electrode from contamination. A gap between the Photocathode and Anode may be a vacuum gap; or may be a gas-medium gap (e.g., air) in which case the gas pressure in the gap is sufficiently low to ensure that a mean free path of electrons accelerating from the Photocathode to the Anode is larger than a distance between them (larger than the gap length). Accommodating the Photocathode and Anode with such an appropriate distance between them allows for eliminating the need for vacuum between them or at least significantly reducing the vacuum requirements. For example, for a 10 micron gap between Photocathode and Anode, the gas pressure of a few mBar may be used.

The invention may be used as a signal transformer for transforming an input signal to any required linear space in accordance with a selected base function. This is implemented by irradiating the Photocathode with a photon flux J(t) (light signal) which is a function of the input signal x(t) (e.g., being the input signal itself in the case of optical fiber connected to a communication network) and by modulating the Gate voltage with the base function V(t), or vice versa, by modulating the Gate voltage with signal x(t) and modulating the light with the base function V(t).

The invention may be used as a signal correlator. Additionally, the invention may be used as a signal identifier, e.g., router or firewall in a communication network. This is implemented by irradiating the Photocathode with light indicative of a first signal, x(t), including a signal component, y(t), which is to be identified (extracted), for example considering that the signal x(t) comes from the network, and modulating the Gate voltage with said signal component.

The invention may also be advantageously used for processing high frequency signals (e.g., RF frequency), without the need for reducing the input signal frequency.

Another possible application of the present invention is associated with a DNA research, which is a highly used computational operation in the bioinformatics field. Generally speaking, this consists of the DNA string comparison:

Two sections of genome are to be compared computationally (either originating from the same organism or from two different organisms). Usually, one of these genome sections is relatively short and the other maybe the entire genome. Keeping in mind that the entire genome of any organism maybe described as a string composed of only four different characters (A, C, T, G), this computational operation is actually a pure string manipulation. There are many purposes for carrying out such string comparison operation. Various types of algorithms have been developed to perform such a comparison. Usually, perfect match is not searched for, because it might not exist (because of slight differences in the genome of different individuals), or because the purpose is to find similar portions in the genome that presumably are responsible for similar functions. Therefore, in general, some kind of correlation is pursued.

The present invention provides for the correlation suitable to be used for these purposes. This may for example be implemented by setting a lot of different variations of the string to be found in different units of an array of triodes, thus obtaining a very efficient processing. The Gates of triodes are set to reflect the string to be looked for, and the other input signal (light signal) is indicative of the part of the genome where the string is looked for.

There is thus provided according to one aspect of the invention, an analog real-time signal processing device configured to perform the electrical signal processing, the device comprising an electronic circuit including at least one basic unit of electrodes, the basic unit being configured to be sensitive to an external field to cause emission of charged particles thereby enabling application of the external field indicative of a first input signal and configured to define at least one second electrical input and one electrical output, thereby providing the electrical output in the form of an approximation of a product of the input first and second electrical signal and the external field.

Preferably, the basic unit thus comprises at least one Photocathode (light sensitive element) for applying an input light signal thereto, at least one input electrode for applying the electrical input thereto, and an output electrode. The electric signal on the output electrode is the approximation of product of the input electrical and light signals.

The device of the invention thus enables performing at least one of the following signal processing operations: transformation of one of the input signals to a required linear space in accordance with a selected base function defining the other input signal; determine correlation between the input signals; identification of a certain signal component in one of the input signals by supplying said certain signal component as the other input signal.

According to another aspect of the invention, there is provided an analog real-time signal processing device configured to perform the electrical signal processing, the device comprising an electronic circuit including an electrodes' arrangement formed by at least one basic unit including at least a Photocathode, an Anode and a Gate, thereby allowing to expose the Photocathode to a photon flux indicative of a first input signal, x(t); and an electrical signal generator configured for operating the Gate with a second electrical input signal, V(t), thereby providing an output signal, I(t), at the Anode in the form of an approximation of a product $x(t)\cdot V(t)$.

The electronic circuit may include an array of the basic units (e.g., triodes) arranged such that all the Photocathodes are maintained at the same potential. The configuration is such that either all the triodes (all Photocathodes) are supplied with the same light signal (indicative of the input signal) and different electrical input signals are supplied to the Gates, or all the Gates are supplied with the same voltage signal and the light signals are different.

Preferably, the input signal to be processed is the light signal, and accordingly all the Photocathodes are irradiated with the same photon flux. This facilitates synchronization of processing.

When performing the signal transformation, the electronic circuit also includes an integration circuitry to sum up the currents from all individual triodes thereby getting the transformed signal. The integration circuitry may be formed by an array of capacitors each connected to the corresponding one of the Anodes, or by any other suitable known means for summation of currents or voltages.

According to yet another aspect of the invention, there is thus provided an analog real-time signal processing device for performing electrical signal processing, the device comprising an electronic circuit formed by an electrodes' arrangement including an array of basic units each including at least a Photocathode, an Anode and a Gate; the device being configured such that all the Photocathodes are maintained at the same potential, and each of the basic units is operable by two input signals including a photon flux indicative of the first input signal for extracting electrons from the Photocathode and a second input electrical signal supplied to the Gate, such that either one of the input signals is the same for all the basic units and the other input signal is different for different basic units, an output signal at each of the Anodes being therefore in the form of a product of the respective two input signals.

According to yet another aspect of the invention, there is provided an analog real-time signal transformer device for performing electrical transformation, the device comprising an electronic circuit including an electrodes' arrangement formed by a predetermined number of basic units each including at least a Photocathode, an Anode and a Gate, thereby allowing for electrons' extraction from the Photocathode by a photon flux being a function of an input signal, x(t), that is to undergo certain transformation; an electrical signal generator for supplying to the Gate a certain base function, V(t), defining said transformation, the device being thereby operable to provide an output signal at the Anode electrode of the basic unit in the form of said transformation of the input signal.

According to yet another aspect of the invention, there is provided an analog real-time signal processing device for performing electrical signal processing, the device comprising:

an electronic circuit including an electrodes' arrangement formed by at least one basic unit including at least a Photocathode, Anode and a Gate, thereby allowing for extracting electrons from the Photocathode by a photon flux in the form of a function of an input signal x(t) coming from a communication network, which is to undergo the signal processing to extract therefrom a required signal an electrical signal generator for supplying to the Gate electrode said required signal, y(t);

the device thereby providing an output signal at the Anode in the form of approximation of a product, x(t)·y(t), thereby enabling extraction of the required signal from the input signal.

The required signal may be a code for specific IP address, specific virus signature, etc.

According to yet another aspect of the invention, there is provided a method for use in an analog real-time signal processing, the method comprising: providing an electronic circuit including at least one basic unit of electrodes configured to define at least one electrical input and one electrical output, and to be sensitive to an external field causing emission of charged particles; operating the basic unit with a first input signal indicative of said external field and a second electrical input signal, thereby providing the output in the form of an approximation of a product of the input first and second signals.

According to yet another aspect of the invention, there is provided a method for use in an analog real-time signal processing, the method comprising:

providing an electronic circuit including an electrodes' arrangement comprising at least one basic unit including at least a Photocathode, Anode and a Gate, and allowing extraction of electrons from the Photocathode by a photon flux being indicative of an input signal, x(t);

operating the Gate by an input electrical signal V(t);

the method thereby providing for obtaining an output signal at the Anode in the form of approximation of a product of said input signals, thereby enabling to carry out at least one of the following signal processing operations: transformation one of the input signals to a required linear space in accordance with a selected base function defining the other input signal; determination of correlation between the input signals; identification of a required signal contained in one of the input signals by supplying said required signal as the other input signal.

According to yet another aspect of the invention, there is provided an electronic device including a Cathode electrode, a Gate electrode, and an Anode electrode, which are arranged such that a distance l between the Cathode' surface by which it faces the Anode and the Gate's surface by which it faces the Anode is significantly smaller than a distance L between the facing surfaces of the Cathode and the Anode, an Anode current $I_a$ being a substantially linear function of a voltage on the Gate.

For example, distance is approximately 0.05 L.

The device may include an additional electrode located closer to the Anode. For example, distance l is approximately 0.01 L, and a distance d between the Anode's surface by which is faces the Cathode and a surface of said additional electrode by which it faces the Cathode's plane is about 0.1 L.

The Gate electrode may be located substantially in the Cathode's plane, i.e., the Gate surrounding the Cathode with a distance l' between the Gate and Cathode in the same plane. In this configuration, l' may for example be approximately equal to distance l. The device may include a second additional electrode located in a plane between the Cathode and the Gate. A distance if between the inward facing surfaces of the Cathode and the second additional electrode, may be substantially equal to a distance $l_1$ between the inward facing surfaces of the second additional electrode and the Gate 12 (12), and to the distance d. Each of these distances may for example be about 0.03 L.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1A:
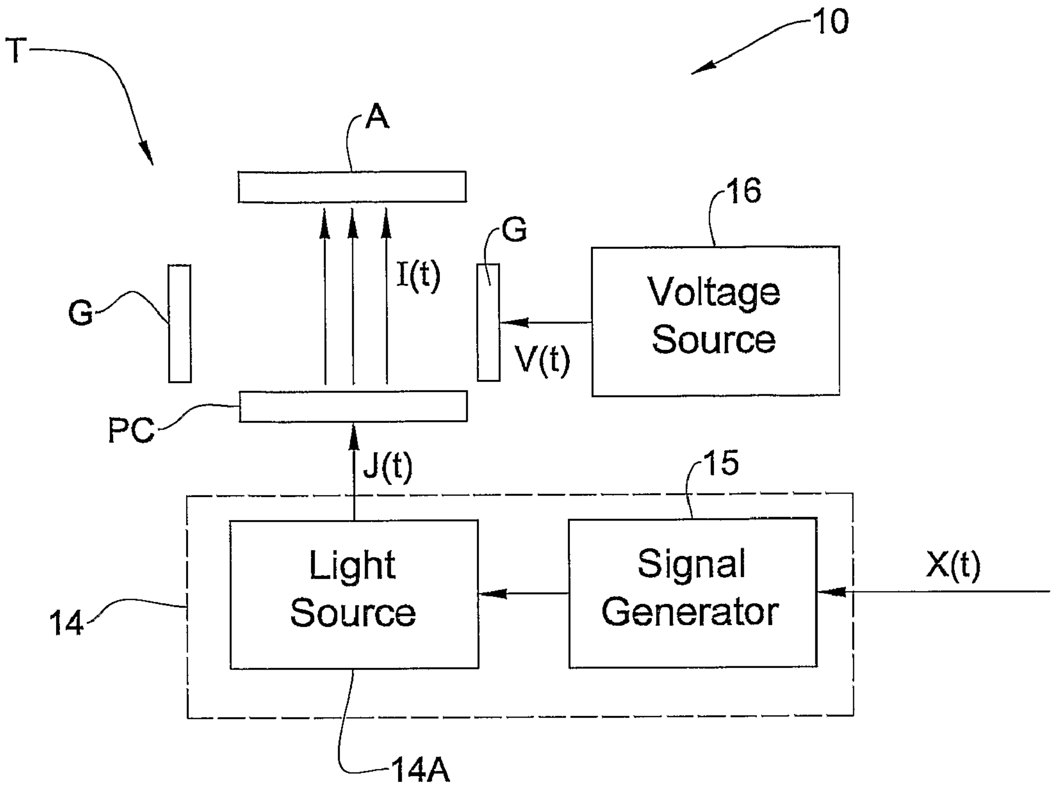
FIGS. 1A and 1B are schematic illustrations of two examples, respectively, of an analog signal processing device of the present invention.
Figure 1B:
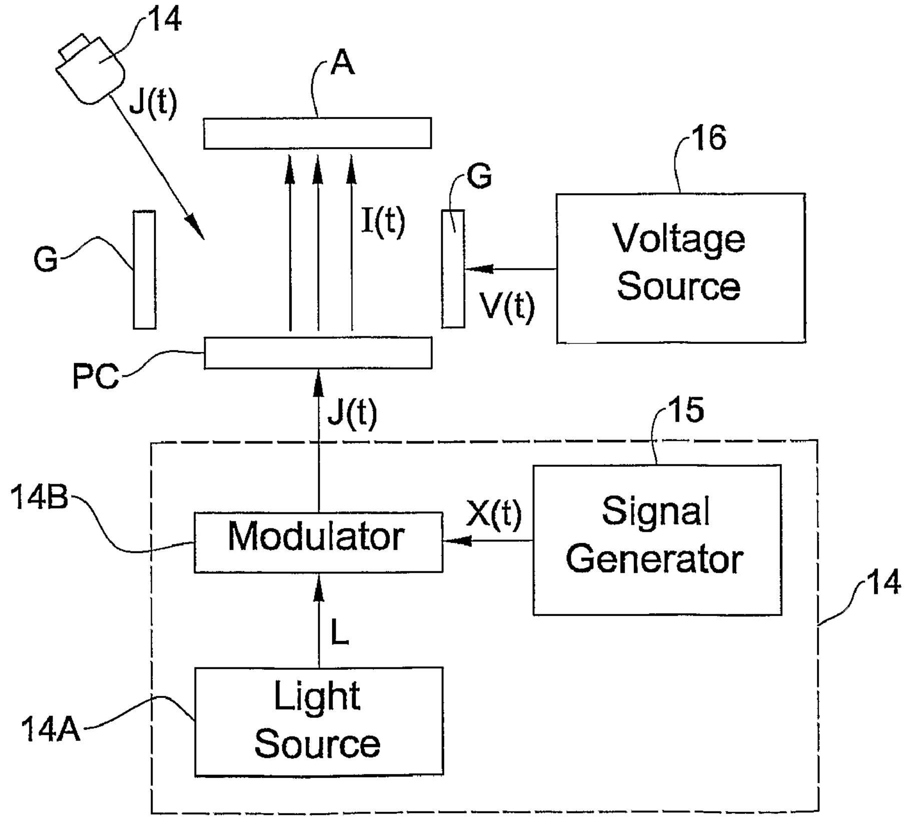

Referring to FIGS. 1A and 1B, there are schematically illustrated two examples of a basic unit 10 of an analog real-time signal processing device of the present invention. The device is configured and operable to provide electrical mathematical transformation of functions (or signals).

In the present example, the device 10 is configured as a triode (e.g., transistor) T including a Photocathode PC, an anode A, and a Gate G (which is formed by two spaced-apart electrodes that are electrically connected together) between the Photocathode and Anode. The Photocathode PC is exposed to a photon flux J(t) being a function of an input signal x(t).

In the present example of FIG. 1A, this is implemented using an illuminating assembly 14 including a light source system 14A and a signal generator 15. The signal generator 15 receives an input signal x(t), and operates the light source system 14A to generate the corresponding photon flux J(t).

In FIG. 1B, the same is achieved by passing light L generated by a light source system 14A through a light modulator 14B (e.g., liquid crystal based modulator) which is operated by the input signal x(t).

In both examples, the photon flux J(t) generated by the illuminating assembly 14 is a function of the input signal x(t). It should, however, be understood that the signal generator 15 as well as the entire illuminating assembly 14 may not be part of the device of the present invention. Light modulated in accordance with the input signal x(t) could come from various illumination sources.

As also shown in FIGS. 1A and 1B, another signal generator (voltage source) 16 is provided to operate the Gate G to supply thereto a certain electrical input signal V(t).

Thus, the basic unit 10 is configured to be light sensitive (due to the use of Photocathode), and to define an electrical input (generally at least one electrical input)—Gate, and the output—Anode.

One of the input signals, x(t) and V(t), is the signal to undergo desired signal processing. The signal which is to undergo the processing may be a signal coming from a communication network. In this connection, it should be noted, although not specifically shown, that the generator of an input signal to be processed (signal generator 15 or 16) may be constituted by the respective utility of the communication network. Considering that the input signal x(t) associated with light illuminating the Photocathode is the signal to be processed, the illuminating assembly 14 may be constituted by an optical fiber connected to the communication network, in which case the input signal x(t) is constituted by the photon flux J(t) coming from the network. Thus, generally speaking, the photon flux J(t) irradiating the Photocathode is indicative of the input signal x(t), and may for example be the input signal itself.

In the examples of FIGS. 1A and 2B, the Photocathode is semi-transparent and the input light signal illuminates the Photocathode from below. It should be understood, and also shown in FIG. 1B in dashed curves, that the input light signal may be supplied as direct illumination of the reflective Photocathode, or may be constituted by reflections from the illuminated Anode, or may be constituted by both the Photocathode and Anode illumination such that the photon flux reaching the Photocathode includes (also) reflections from Anode.

During the device operation, Photocathode PC is illuminated with the photon flux J(t) (i.e., is inputted with a first signal x(t)) thus causing electrons' extraction from Photocathode PC and affecting an electric current from Photocathode PC to Anode A; and the certain voltage signal V(t) is input at the Gate G which voltage signal in turn affects the electric current from the Photocathode to the Anode. The resulting electric current at Anode, I(t), is the approximation of x(t)·V(t). As indicated above, various generally known electrical connections used in the device of the present invention are not specifically described. It should be understood that the actual voltage signal considered in the product x(t)·V(t), is $(V(t)-V_0(t))$, where $V_0(t)$ is the threshold voltage (the point where the IV-curve starts to rise).

When operating in the linear range of a transistor, the effect of the Gate on the current from Photocathode to Anode is a simple multiplication by some factor: I(t)=k·x(t)·V(t), wherein k is indicative of the effective gain of the specific transistor (the measure of the effect of the Gate voltage on the cathode current), and the overall quantum efficiency of the Photocathode, which determines the proportion between the photon flux and the resulting Photocathode current. The properties of the Photocathode, as well as the geometries of the electrodes of the transistor, affect the value of k.

The device of the present invention may be operable as a signal transformer. The input signal, x(t), to be transformed to a required linear space is either supplied to the illuminating assembly (to the light modulator 14B or to the signal generator 15) or is a light signal coming from an optical fiber, and the other input signal, V(t), presents a base function of the required transformation and is supplied to the Gate. Generally, the configuration may be such that the signal to be processed is signal V(t) supplied to the Gate and the base function is presented by signal x(t) associated with the illumination. In either case, the output current is proportional to the product of the two input functions.

The device of the present invention may also be operable as a signal correlator. According to yet another embodiment of the invention, the device may be operable for identifying (extracting) a required signal component from the input signal, which is implemented by using the required signal component as the other input signal.

For better understanding of the invention, the following example of determining the coefficients of the Fourier series of a periodic signal is considered.

For a periodic signal (function)

$$x(t) = \sum_{k=-\infty}^{+\infty} a_k e^{jkw_0 t} \tag{1}$$

where coefficients $a_k$ are described by $$a_k = \frac{1}{T_0} \int_{T0} x(t) e^{-jkw_0 t} dt \tag{2}$$

where $T_0$ is the period of the signal x(t).

Figure 2:
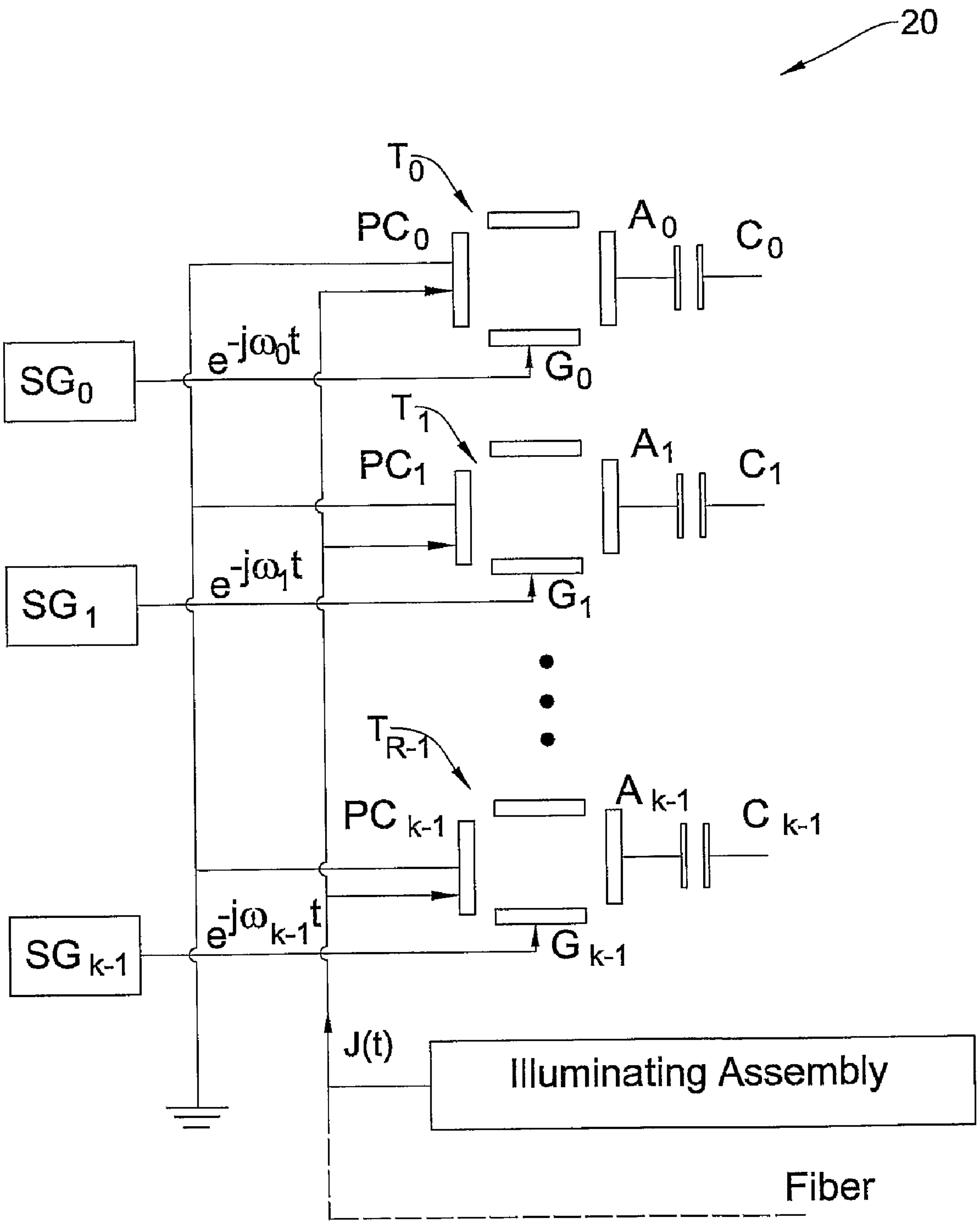
FIG. 2 illustrates yet another example of an analog signal processing device of the present invention.

The main problem that needs to be solved is the calculation of the coefficients $a_k$. In this connection, reference is made to FIG. 2 schematically illustrating another example of an analog real-time signal processing device 20 of the present invention which can be operable as a signal transformer.

The device 20 includes an array of k basic units (e.g., triodes or transistors), $T_0, \ldots, T_{k-1}$, all illuminated by the same photon flux J(t) (preferably, produced by the same illuminating assembly 14), namely all Photocathodes $PC_0$-$PC_{k-1}$ of all the transistors $T_0$-$T_{k-1}$ are exposed to the same photon flux. The photon flux is indicative of an input signal x(t), e.g., by using the illuminating assembly 14 operated by the input signal x(t) such that the photon flux J(t) is a substantially linear function of this signal x(t). Photocathodes $PC_0$-$PC_{k-1}$ of all the transistors $T_0$-$T_{k-1}$ are maintained at the same potential (e.g., all are grounded). Device 20 is associated with a signal generator unit 15 including a plurality of signal generators $SG_0$-$SG_{k-1}$, each connected to a corresponding one of k Gates $G_0$-$G_{k-1}$, to input the different Gates with different base functions. Generally, the Gate of the $n^{th}$ transistor is operated by a base function of $e^{-jnw_0 t}$ which corresponds to a sine wave signal at frequency of $nw_0t$.

The base functions are characterized by index n which is 0<n<(k−1), where n=0 corresponds to the DC case and n=(k−1) corresponds to a frequency of $kw_0$, which is the cutoff frequency of the signal as defined by the bandwidth of the signal, and where $w_0=2\pi/T_0$. Thus, at the $n^{th}$ Anode of the $n^{th}$ transistor, the electric current is the product $x(t)\cdot\sin(kw_n t)$.

It should be noted that the invention preferably utilizes a sufficiently linear transistor configuration, both in the transistor's operation dependence on the light intensity as described above and in the Gate control on the electric current at the Anode. The desired linearity of the transistor can be achieved by appropriately designing the electrodes' arrangement of the transistor, namely, dimensions of the electrodes and their relative accommodation. An example of the suitable electrodes' arrangement will be described below. Also, sine and cosine functions are considered when specifying the base function $e^{-jnw_0 t}$.

As further shown in FIG. 2, an array of k capacitors $C^{(0)}$-$C^{(k-1)}$ (or any equivalent circuits) is preferably provided, each capacitor being connected to the corresponding one of the Anodes $A^{(0)}$-$A^{(k-1)}$. The capacitor performs an integral of the product $x(t)\, e^{-jkw_n t}$ at period $T_0$, which can be selected according to the period of the input signal, x(t), and an appropriate integration circuitry. The output of the capacitor/integration circuitry is therefore:

$$S_{out}(t) = \int_{T0} x(t)e^{-jkw_0t}dt \tag{3}$$

which is an un-normalized value of the coefficient $a_k$ (Eq. 2).

For all practical applications, normalization of $a_k$ is not necessary. However, if needed, coefficients $a_k$ can be easily normalized either by the integration circuitry or by adding a normalizing circuitry (e.g. in the form of a resistor).

By varying the base function (replacing the base function $e^{-jnw_0t}$ with other functions), the input signal x(t) can be transformed to any required linear space. To this end, the only requirement is to connect the base function generators to the Gates of the transistors $T_0$-$T_{k-1}$.

It should be understood that the signal transformer device of the present invention may be a part of or a stand alone integrated device (chip) manufactured using any suitable known technique (e.g., standard silicon manufacturing techniques). Hence, the number of transistors can be very large (in the order of 10 millions or more).

The signal generator can include a digital to analog converter, for example the digital representation of the input signal may be produced by registers in a CPU and then converted to analog signal, or digital signal may be directly supplied using an array of Gates. It should be understood that according to the invention, the base functions do not need to be generated by an array of analog circuits, but rather sampled functions may be generated by a program running on a CPU and a digital-to-analog converter is used to convert these functions into analog signals. The present invention provides for a very complex and very high resolution signal processing (e.g., space transformer).

The use of the Photocathode and the input light signal allows for using a single electrons' extractor (illuminator) to eject electrons in all the transistors in the array. Since the response time for electron emission in the photo-electric effect is in order of femtoseconds, the result is very accurate and the operation is well synchronized over all the transistors.

It should be noted that although the above example of FIG. 2 illustrates a Fourier transform of a periodic signal, the same technique, using the appropriate base functions, may be used for any other transformation and of any function, regardless of whether it is periodic or not.

As indicated above, the present invention can be used also for performing signal correlation. Turning back to FIG. 1 for example, the signal generator 15 operates the light source 14A (or a light modulator 14B at the output of the light source 14A) with input signal x(t), and the signal generator 16 operates the Gate with another input signal y(t). The output at the Anode, if connected to an integrator circuitry (e.g., capacitors), is the correlation between x(t) and y(t). This function has many applications for example in speech compression and voice manipulations.

The integrator circuitry may be configured in any known suitable way. The construction and operation of such integrator circuitry are known per se and therefore need not be described in detail. The integrator circuitry is configured to perform the so-called "sliding window integration": the two functions (signals) are multiplied and integrated, then one of the functions is dt shifted (which is determined by the bandwidth of the respective signal) and the signals are again multiplied and integrated. There are several known ways to implement this. One specific but not limiting example for identifying a signal is as follows: the signal to be processed (e.g., identified) in provided in various phases as base functions; in real-time processing, if one of these base functions matches the output (after the integration) it is the highest output signal.

Another possible example of the operation of the device of the present invention is for identifying (extracting) a required signal component from the input signal. This may be used for routing. To this end, the basic concept is that each base function (input signal at the Gate) is an entry at the routing table, and a "match" occurs only if the input signal x(t) (e.g., input signal operating the illuminating assembly) correlates with the destination routing entry. The same property of the device may be used in a physical firewall. Here, the basic concept is that the base functions present IP addresses or strings that the firewall is to look for in the input signal x(t). It should be noted that in both of these applications, since the number of the base functions (number of transistors in the array) can be of about 10 millions or more, the possible functionality is for very high bandwidths.

It should be noted that for both of the above applications, the input signal needs not be a physical (Ethernet) signal. It may be, as well, layer 2 or 3 of the signal (meaning after demodulation of the Ethernet signal and/or after decoding the link layer protocol). It should also be noted that the present invention may be used for other protocols (both physical and logical). Moreover, as indicated above with reference to FIGS. 1A and 1B, when for example a fiber optic is the carrier of the communication network, there is no need for a light source and signal generator/modulator, and the optical signal x(t) is the photon flux J(t) fed to the Photocathode directly from the fiber (i.e., from the network). It should be understood that the fiber optic is an example only, and generally light from LED, or any other light, including ambient light, may be used for extracting electrons from Photocathode.

The present invention may also be advantageously used for processing high-frequency signals, at the RF level. According to the conventional techniques of the kind specified, the high-frequency signal to be processed has to be first lowered to the intermediate frequency level. When dealing with real-time high bandwidth signals, this results in unavoidable loss of useful data. The present invention provides for performing some of the processing in the RF level (e.g. transformation, correlation), thus providing for filtering the original RF signal itself and thus improving the SNR at the antenna level (which produces the best performance).

The device of the present invention may be operable as a wide bandwidth integrator/derivator. This provides for carrying out correction for drift in navigational systems.

The device of the present invention may be used as a front-end analogue sensor, where some relatively simple processing is needed. Conventional techniques of the kind specified require the use of analog-to-digital conversion, digital signal processing and sometimes the back digital-to-analog conversion. The invented technique advantageously provides for pure analog, real-time, signal processing. An example for such a front-end analogue sensor is an air-bag system used in a vehicle. This system has to operate continuously in full capacity, and to share CPU time with other processes that are running on the same chip. The invented device can perform the entire operation in the real-time analogue fashion, without the need for loading the digital CPU at all. The technical fields where such sensors are used include automotive, avionics, and military systems where a lot of (analogue) sensors are required.

Figure 3A:
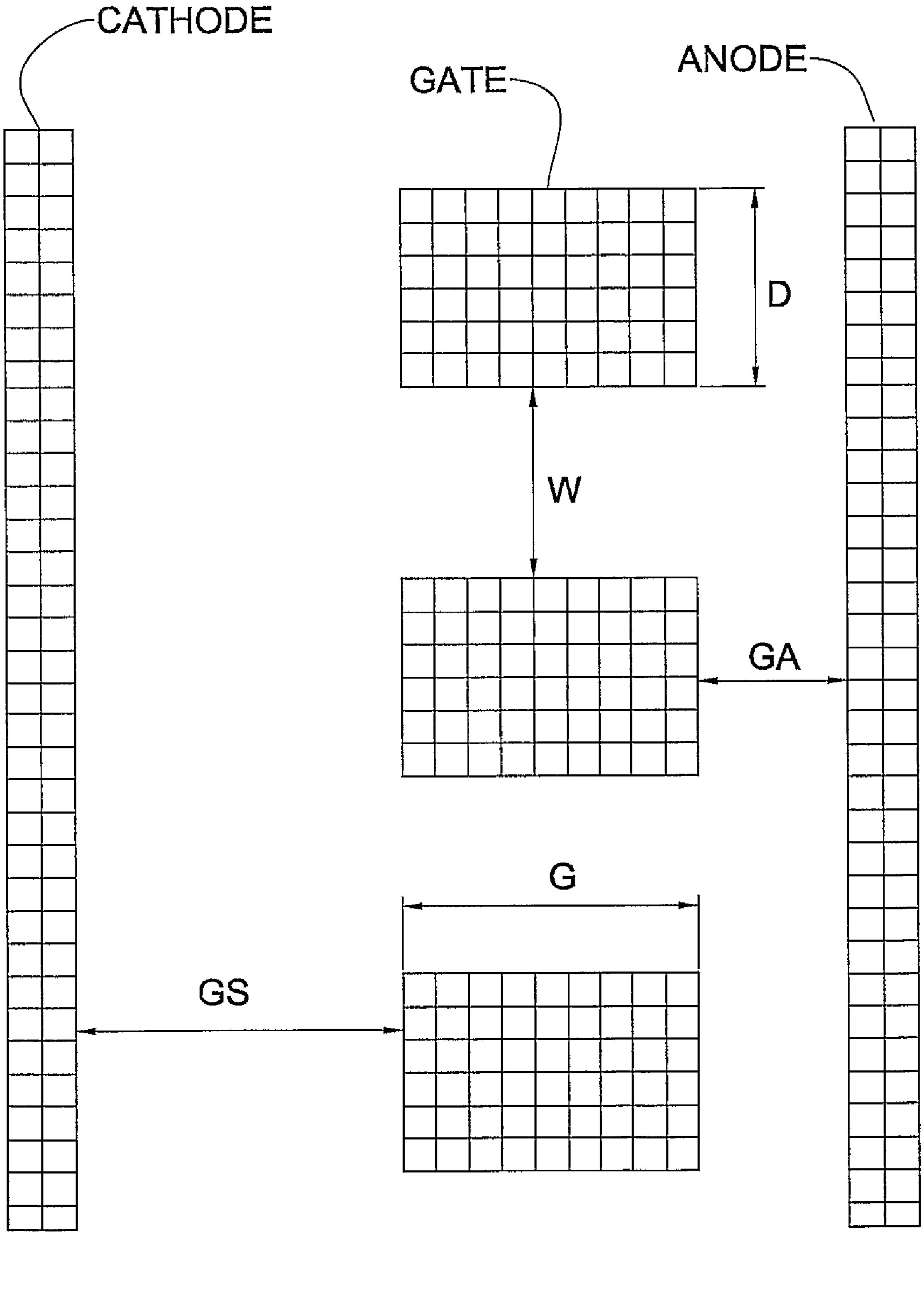
FIGS. 3A-3B, 4 and 5A-5G illustrate some examples of the effect of electrodes' configuration (dimensions and/or relative accommodation) in a cavity of the triode structure, on the structure operation.
Figure 3B:
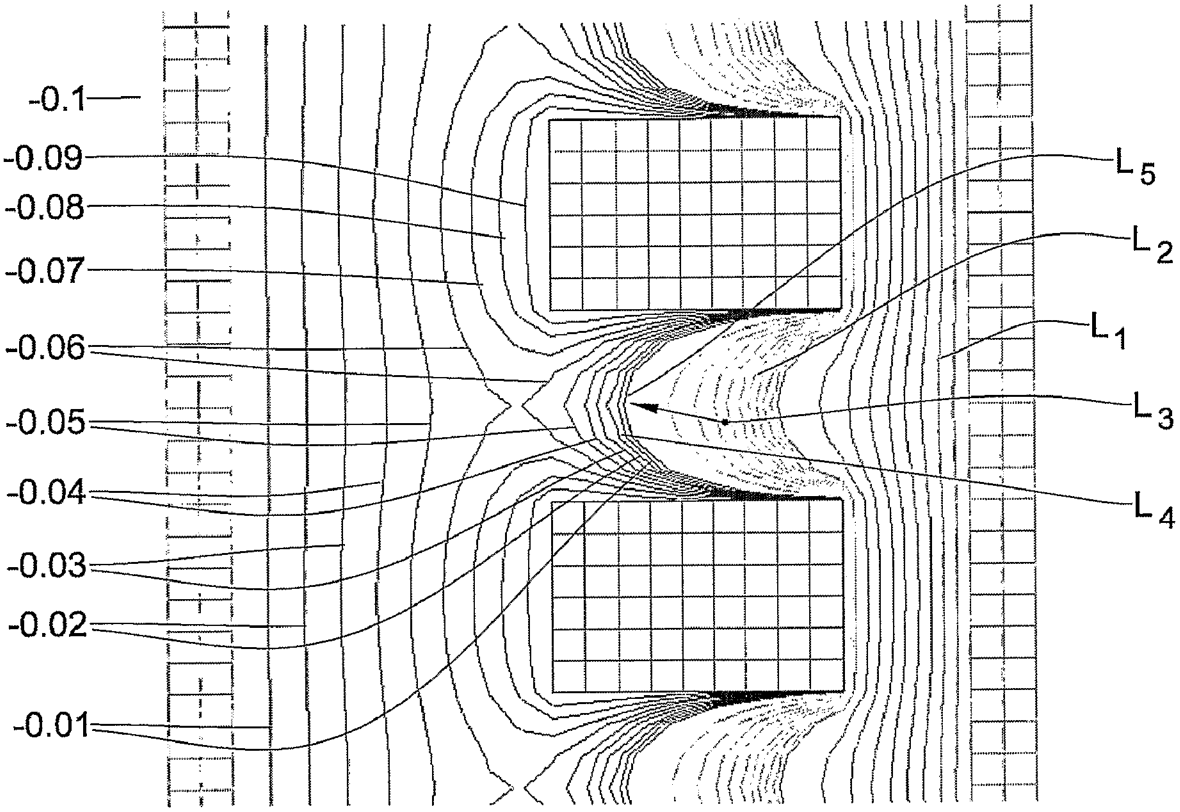
Figure 4:
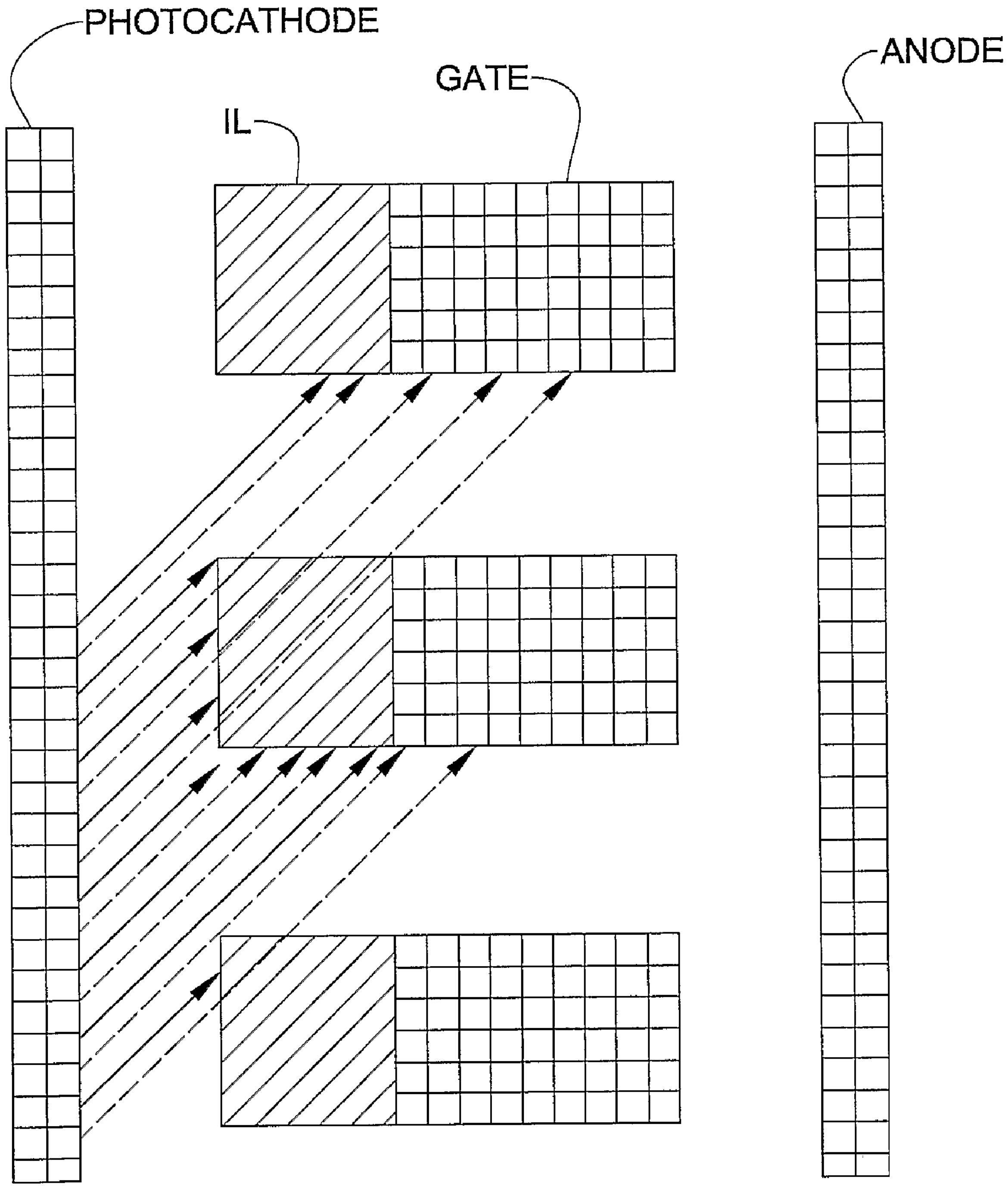

Reference is made to FIGS. 3A-3B and 4, illustrating effects of the electrodes dimensions and relative accommodation on the transistor operation.

FIG. 3A shows the basic configuration formed by an array of parallel cavities (basic units), each having Photocathode, Anode and Gate electrodes. In the present example, the common continuous Photocathode and Anode electrodes are used and the individual cavities are formed by spaced-apart Gate electrodes each of a dimension D×G and spaced from each other a distance W, which are electrically connected together. It should, however, be understood that such a structure is exemplified here solely for sake of dimensions and proportions considerations, and the results are also applicable to the case where each cavity (basic unit) is electrically separated (i.e., an array of Photocathodes and an array of Anodes are used).

FIG. 3B shows simulation results for the distribution of electrical potential (equi-potential lines), for the case of Anode voltage of 10V and Gate voltage of (−0.1)V. In the figure, equi-potential lines $L_1$ correspond to voltages 9V−1V (along x-direction, at 1V resolution); equi-potential lines $L_2$ correspond to, voltages 0.9V−0.1 (0.1V resolution); equi-potential line $L_3$ corresponds to 0V potential; and equi-potential lines $L_4$ correspond to the potentials (−0.01)−(−0.09) (line $L_5$ towards the gate, 0.0V resolution). As shown, the distribution of the electrical potential is not uniform. This is because of the patterned nature of the Gate electrodes.

Hence, an appropriate proportion between the elements of the transistor should be provided to obtain desired linearity of the transistor. The invention, in its other aspects, provides various solutions for this problem. A linear transistor configuration may advantageously be used in various applications, including amplifying, controlling, and generating electrical signals. The amount of circuit current that flows through a transistor depends in a precise manner on the input current or voltage applied through or across its terminals. The exact manner in which the output current depends on the supplied current/voltage is, however, difficult to adjust to specific needs. In particular, a device in which this dependence is to a good approximation linear is much sought after, especially for amplification purposes, but difficult to obtain.

For example, the inventors have found that the proportion between the Gate length G and the cavity width W might be a factor that affects the I-V characteristics of the device. A low value of the ratio G/W (less than 1, e.g. ⅙) suits the applications where high yield (and overall efficiency of device) is needed, as well as low Gate currents, at the expense of lower mutual conductance, lower gain and poorer linearity. A high value of the ratio G/W (greater than 1, e.g. 3-5 or even higher) results in high linearity (very low values of high harmonics), high mutual conductance and high gain, at the expense of lower yield and higher gate currents (up to the situation when only a small fraction of the photocurrent reaches the Anode). This can be undesirable, for example, for power switching applications or other applications where the device efficiency is a key factor. However, if the absence of high harmonics is important for some specific application such as the present invention, a high G/W ratio is preferred for better performance of the device.

FIG. 4 illustrates another example of the device configuration (multiple-triode configuration in the present example), that can be used for improving the linearity of the device operation. This configuration is similar to the basic one of FIG. 3A, but has an insulating layer IL between the Gate and the Photocathode (while in physical contact with the Gate). This configuration provides for much lower Gate currents, as the layer IL shields most of electrons that would otherwise reach the Gates electrodes. It also improves the linearity of the triode (transistor) device. The provision of the insulating layer IL filters photoelectrons emitted at high angles relative to the normal to the Cathode surface. As shown in the figure in dashed lines, in the absence of the insulator layer IL, these high-angle electrons emitted from Photocathode of one cavity might reach the Gate of another cavity. The wider this insulating layer IL, the stronger the filter and the lower the Gate current. On the other hand, very wide layer IL, while still contributing to the linearity of the device, will reduce the total Anode current. Again, it is a tradeoff that should be balanced according to the device application. For the purpose of the present invention, the widest layer IL may be used (i.e., it may physically contact both the Gate electrode and the Photocathode electrode), thus blocking totally any cross talking between adjacent cavities and improving linearity to the maximum.

The device is preferably constructed such that Photocathode-Anode distance is at the order of a few microns or less (i.e., less than 10 microns). The spectrum of light illuminating the Photocathode should preferably be as narrow as possible and as close as possible to the work function of the Photocathode, so as to provide emitted electron having a narrow energy distribution. This will improve linearity, specifically, resulting in a sharper rise of the I-V curve at the cutoff point (near the stopping voltage). For manufacturing a device with a high ratio G/W, photolithography technology of the highest available resolution should preferably be used in order to keep the overall vertical dimension of the device (small enough to meet the above-mentioned requirement for the Photocathode-Anode). For example, for a 200 nm technology W=0.2 μm, constructing a Gate with G=1 μm and assuming another 0.5 μm for both Gate-Anode and Gate-Photocathode distances, gives a cavity 2×0.2 μm in size. Such dimensions meet all the above-specified conditions.

Yet another solution for the above problem (a very linear dependence of the output signal (Anode current) on the input signal (Gate voltage), $I_a(V_g)$, over a considerable range of (Gate) voltages) consists of using a particular configuration of the Cathode (e.g. Photocathode considering the above described signal processing application of the device), Gate and Anode (although other electrodes may be used to enhance the effect) may provide. This is exemplified in FIGS. 5A-5G.

The present invention rests on a basic electrode arrangement including a Cathode electrode (e.g. Photocathode considering the signal processing functions described above), a Gate electrode, and an Anode electrode, where the Cathode and Anode are accommodated as parallel, oppositely-facing surfaces, and the Gate is significantly closer to the Cathode than to the Anode. The Gate electrode is not a grid and is not aligned with the electron-emitting surface area of the Cathode (i.e. does not cover the electron-emitting region of Cathode). Charge carriers, such as electrons, are either emitted by the Cathode or injected into the device through a suitable aperture in the Cathode-wall. In the former case, thermo-, field, or photo-emission, or any combination thereof, can be used to induce emission from an "emission region" of the Cathode region facing the Anode. In the latter case, the Anode facing surface need not to comprise a Cathode electrode—the kinetic energy of the injected particles reflects the effective potential at the surface plane. Although in the description photoemission of electrons from the Cathode is exemplified, the invention is not limited to this specific example. Therefore, any further reference to emission, to the Cathode, and to electrons, should be understood as, respectively, a reference also to injection, to the Anode-facing wall in general, and to charge-carriers in general.

A space between the electrodes may contain any kind of gas at the desired pressure, or rather, vacuum to the desired degree. It is preferable that the Cathode-Anode distance does not exceed the mean free path of the particles traversing the medium, in order to avoid collisions that may give rise to secondary emission, excessive dispersion, etc.

The output current of a device according to the disclosed embodiments is the Anode current generated by electrons that reach the Anode. It is, in principle, also possible to incorporate an additional floating electrode in order to obtain an output voltage dependent on the electrons reaching said additional electrode. The dependence of the Anode current on the Gate voltage, henceforth referred to as the $I_a(V_g)$ curve, of a device is highly linear, as will be described below. The linearity of the $I_a(V_g)$ curve renders the use of the devices of the present invention particularly advantageous in applications such as modulation and demodulation, amplification, mixing, etc., and can help reduce power consumption.

The linearity of the $I_a(V_g)$ curve is obtained by particular placement of the control Gate electrode. The Gate electrode, in the basic construction of the present invention, is located in a plane at a distance from the Cathode at least an order of magnitude smaller than a distance between the Cathode and the Anode. It should be noted that the relatively large Gate-Anode distance reduces the Gate-Anode capacitance. The Gate electrode itself is adjacent to the Cathode's emission region. The Gate may even be coplanar with the Cathode, and surround the emission region itself. It should also be noted that, because of the location of the Gate, the Gate current is effectively zero. The application of negative voltage to the Gate electrode effects a potential barrier that prevents electrons emitted with insufficient kinetic energy from reaching the Anode. The placement of the Gate is such that electrons released on the outermost edges of the emission region are stopped using the smallest value of (negative) Gate voltage. As the absolute value of Gate voltage is increased, electrons emitted further into the emission region are stopped, until finally none whatsoever reach the Anode.

Figure 5A:
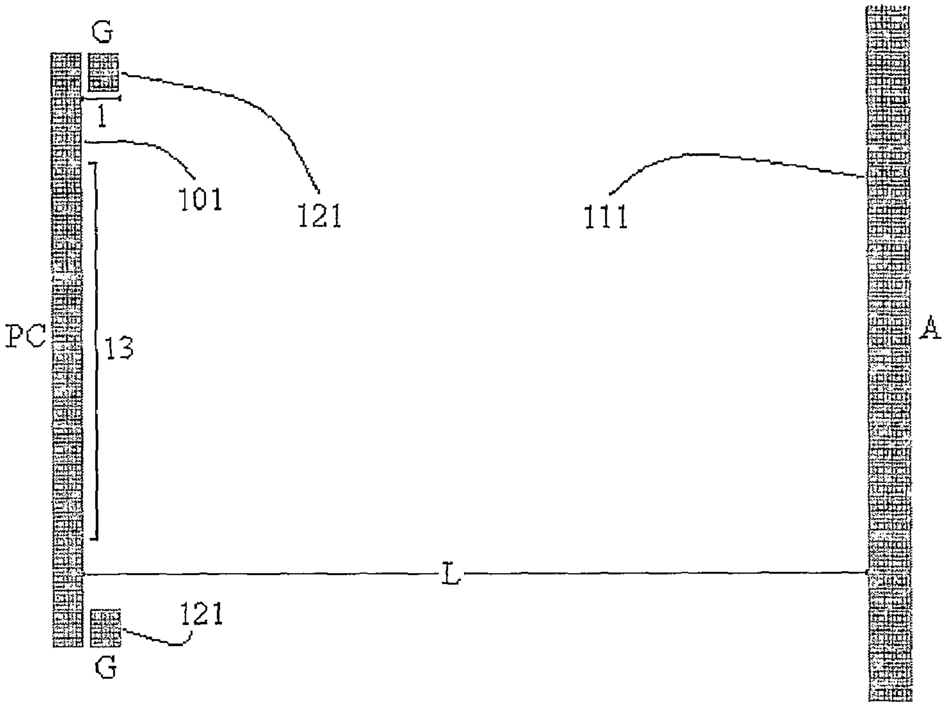
Figure 5B:
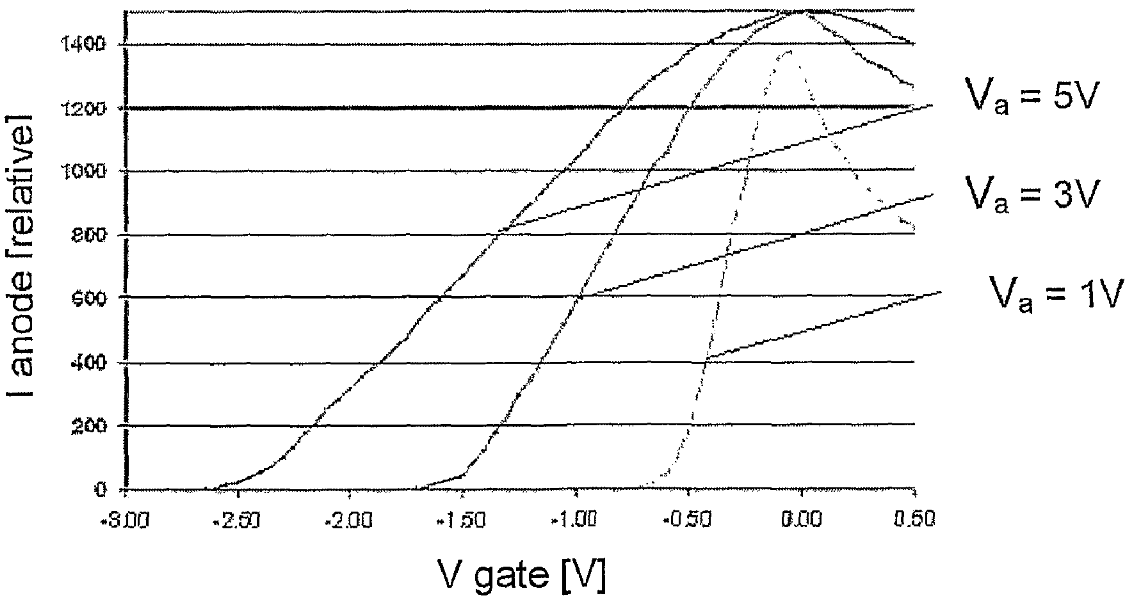

FIG. 5A is a schematic side sectional view of a cylindrically symmetrical triode configuration according to the present invention. The device includes a Photocathode PC, an anode A, and a Gate G. Photocathode has a region 13 exposed to illumination coming from an illumination source (not shown), and thus electrons are emitted from emission region 13 when illuminated. The device is associated with a control unit (not shown) that includes a voltage supply unit operated to controllably vary the voltage supply to the electrodes. A distance l between a surface 121 of the Gate and a surface 101 of the Cathode is approximately 0.05 of a distance L between surface 101 of the Cathode and a surface 111 of the Anode. FIG. 5B shows three $I_a(V_g)$ curves, corresponding to three different Anode voltages $V_a$, $V_a$=1V, $V_a$=3V and $V_a$=5V, zero potential at the Cathode, for the device of FIG. 5A. Evidently, the $I_a(V_g)$ curves are highly linear.

Figure 5C:
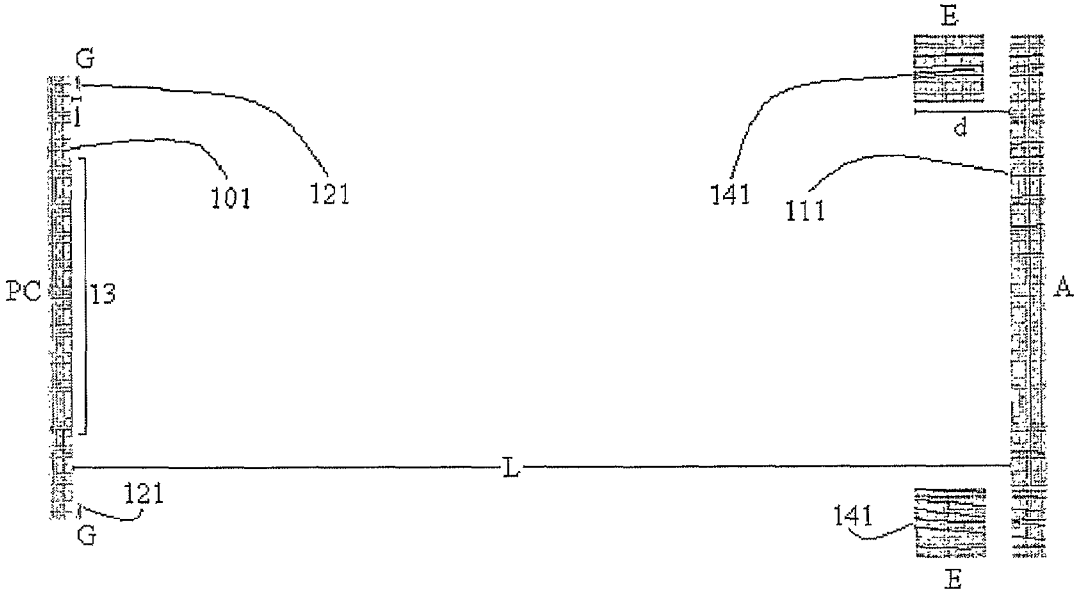
Figure 5D:
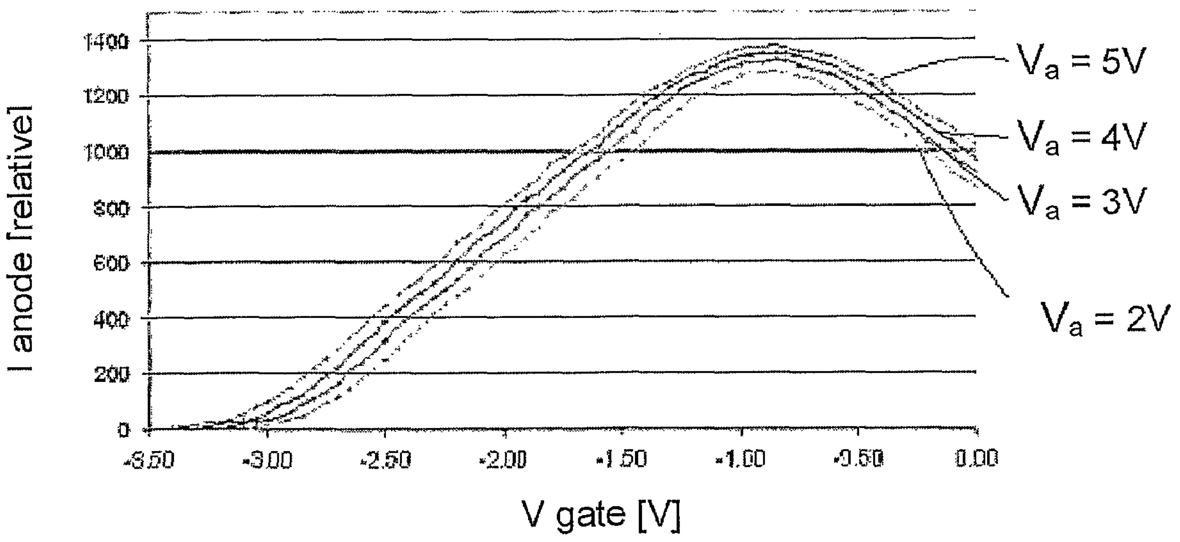

FIG. 5C depicts another exemplary device according to the present invention, generally similar to that of FIG. 5A but including an additional electrode E. Distance l between surface 121 of the Gate and surface 101 of the Cathode is approximately 0.01 of distance L between Cathode's surface 101 Anode's surface 111. A distance d between a surface 141 of electrode E and Anode's surface 111 is about 0.1 of the same. Additional electrode E, along with the optimized proportions of the electrode arrangement, serve for increasing the linearity and for significantly reducing the dependence of the linear slope of each $I_a(V_g)$ curve on the corresponding Anode-Cathode potential (i.e., Anode voltage when the Cathode is at 0V). This is shown in the graphs of FIG. 5D (which correspond to four Anode voltages, 2V, 3V, 4V and 5V with the Cathode at zero potential. Such a configuration might therefore be preferable for RF applications. In addition, electrode E lowers the Gate-Anode capacitance.

Figure 5E:
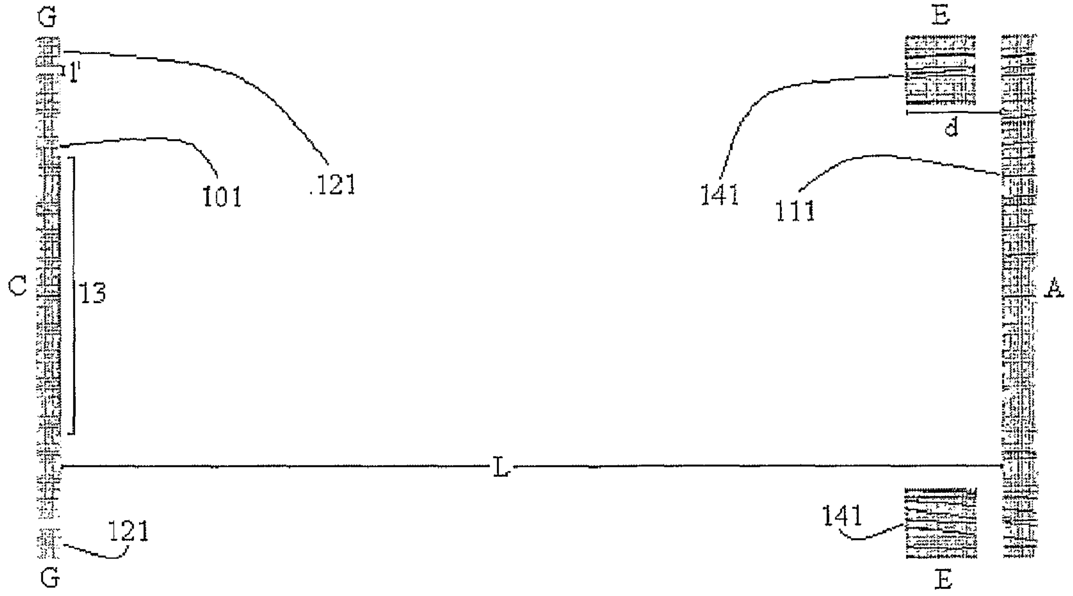
Figure 5F:
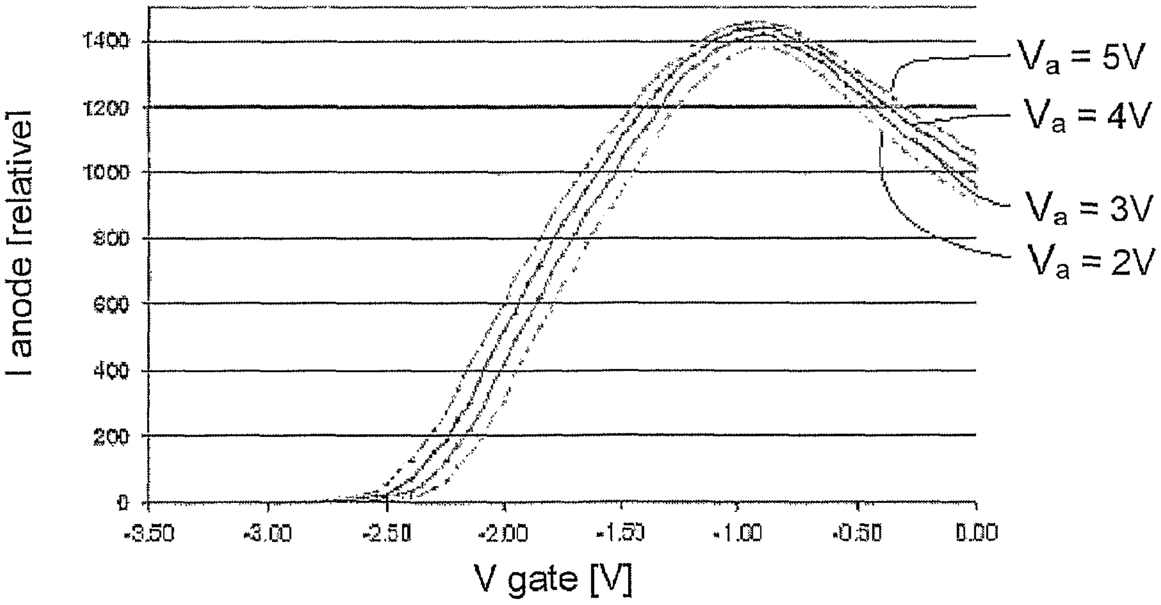

FIG. 5E exemplifies a device almost identical to that of FIG. 5A, distinguishing therefrom in the location (and thickness) of a Gate G, which is here coplanar with a Cathode C. This Gate location has certain advantages. For example, the Gate thickness in this configuration is not as critical as in other embodiments. Moreover, the leakage current between the Cathode and the Gate is reduced by this configuration. A sideways distance l' between the Gate and the Cathode is here approximately equal to distance l in the example of FIG. 5A. FIG. 5F shows the resultant $I_a(V_g)$ curves for the Anode voltages of 2V, 3V, 4V and 5V and zero Cathode potential; evidently the behavior is unchanged.

Figure 5G:
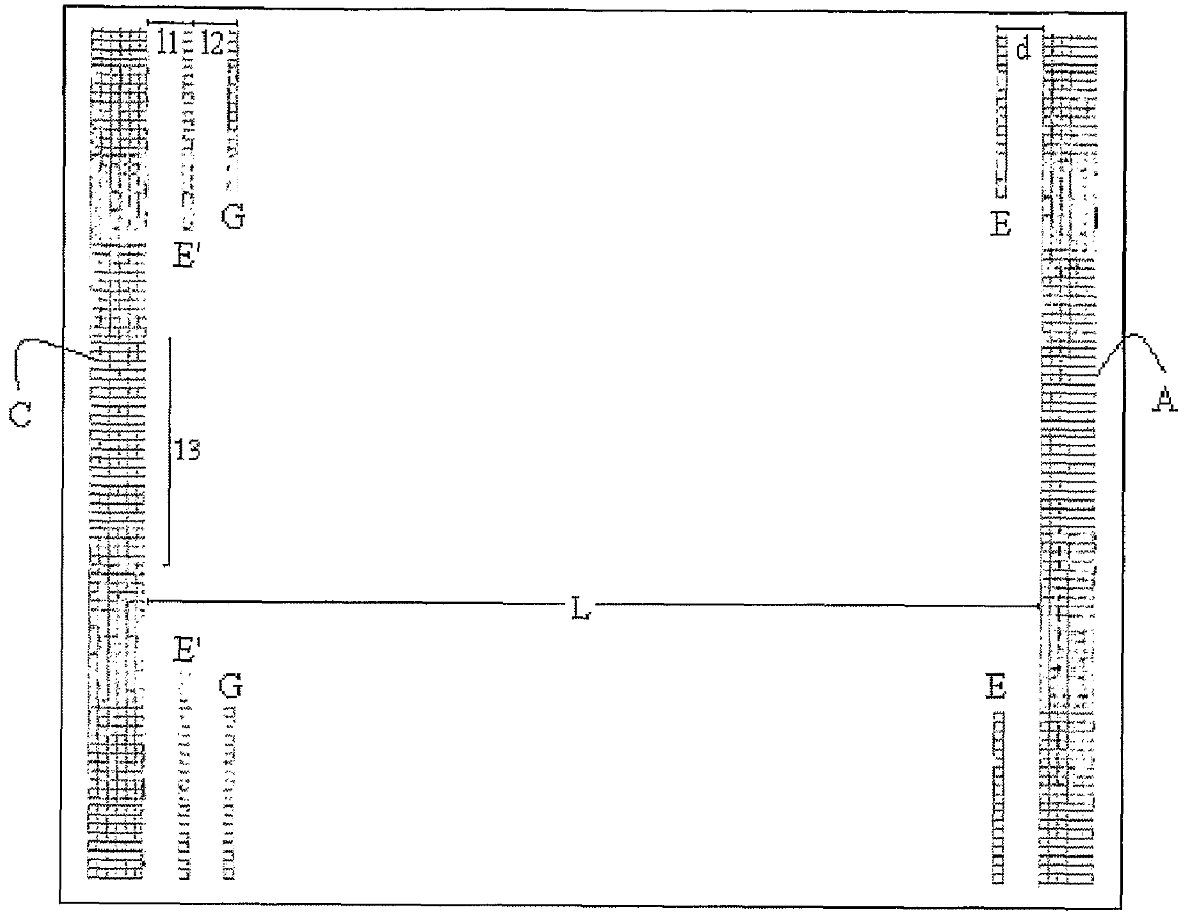

FIG. 5G shows yet another configuration including an additional electrode E' between the Cathode and the Gate. Electrode E' provides a physical mask for the emitted electron beam, allowing for simpler manufacture of a large, continuous Photocathode, and lowers the Cathode-Gate capacitance. A distance $l_1$ between the inward facing surfaces of the Cathode and electrode E', a distance $l_2$ between those of electrode E' and the Gate, and a distance d between the respective surfaces of electrode E and the anode, is each about 0.03 of the Cathode-Anode distance L.

In the embodiments disclosed herein, there is another dimension of interest: the radius of a circular gate, corresponding to the emission region of the Cathode. This radius should preferably be large compared with the Cathode-Gate distance, e.g. 10 times the latter.

In the device of the invention, it is also possible to control the output current (Anode current) by shaping the emission region of the Cathode. Due to the placement of the controlling Gate electrode as described above, the current is affected by the locations on the Cathode surface from which emission occurs. Thus, to achieve better linearity, or any other correction or adjustment to the device's response, the Cathode's emission region (or the injection aperture) may be modified using, e.g., masks.

It is appreciated for a person skilled in the art that a better linearity of the device can also be achieved by using any other technique for setting the energy of electrons, as well as their angle. Generally, the triode device is preferably configured as an electron source that has a defined (small) window of energies and defined (small) windows of angles.

Those skilled in the art to which the present invention pertains can appreciate that while the present invention has been described in terms of preferred embodiments, the concept upon which this disclosure is based may readily be utilized as a basis for the designing of other structures, systems and processes for carrying out the several purposes of the present invention.

Also, it is to be understood that the phraseology and terminology employed herein are for the purpose of description and should not be regarded as limiting.

It is important, therefore, that the scope of the invention is not construed as being limited by the illustrative embodiments set forth herein. Other variations are possible within the scope of the present invention as defined in the appended claims and their equivalents.

The invention claimed is:

1. An analog real-time signal processing device configured to perform electrical signal processing, the device comprising an electronic circuit including at least one basic unit, the basic unit comprising a triode with a Photocathode to cause electrons' emission in response to an input photon flux indicative of a first input signal and at least one Gate electrode for a second electrical input and one Anode for electrical output, thereby providing the electrical output in the form of an approximation of a product of the input first and second signals, wherein the triode is configured with a selected ratio between a length G of the input Gate electrode and a width W of a cavity between the input Gate and the output Anode electrode to provide substantially linear I-V characteristic.

2. The device of claim 1, configured to perform at least one of the following signal processing operations: transformation of one the input signals to a required linear space in accordance with a selected base function defining the other input signal; determine correlation between the input signals; identification of a certain signal component in one of the input signals by supplying said certain signal component as the other input signal.

3. The device of claim 1, wherein the basic unit comprises said at least a Photocathode, an Anode electrode operating as said output electrode and at least one Gate electrode operating as said at least one input electrode; and an electrical signal generator configured for operating the Gate with the second electrical input signal.

4. The device of claim 1, wherein the Photocathode is semi-transparent.

5. The device of claim 1, wherein the Photocathode is connected to a communication network via an optical fiber, said photon flux being therefore the input signal x(t).

6. The device of claim 1, comprising an illuminating assembly comprising a light source system and a signal generator connected to the light source system to modulate operation of the light source system with the input signal x(t), the photon flux being therefore a function of the input signal x(t).

7. The device of claim 1, comprising a light modulator configured and operable to modulate light passing therethrough in accordance with the input signal x(t) to thereby produce the photon flux being a function of the input signal x(t).

8. The device of claim 1, configured to perform at least one of the following signal processing operations: transformation of one of the input signals to a required linear space in accordance with a selected base function defining the other input signal; determine correlation between the input signals; identification of a certain signal component in one of the input signals by supplying said certain signal component as the other input signal.

9. The device of claim 1, wherein the electronic circuit comprises an integration circuitry.

10. The device of claim 9, wherein the integration circuitry comprises an array of capacitors each connected to the corresponding one of the output electrodes of the basic units.

11. The device of claim 1, wherein one of the input light and electrical signals is the input signal to be processed, and the other is a base function of a required transformation, the electrical output signal thereby presenting the required transformation of the input signal.

12. The device of claim 1, wherein one of the input light and electrical signals is the input signal to be processed to identify therein a required signal component, and the other input signal is in the form of said required signal component to be identified.

13. The device of claim 1, wherein the ratio G/W does not exceed 1.

14. The device of claim 1, wherein said ratio G/W is of about ⅙.

15. The device of claim 1, wherein the ratio G/W is higher than 1.

16. The device of claim 15, wherein the ratio G/W is of about 3-5.

17. An analog real-time signal processing device configured to perform electrical signal processing, the device comprising an electronic circuit that includes an array of the basic units, each basic unit comprising at least one Photocathode for applying thereto an input photon flux indicative of a first input signal to cause electrons' emission in response to the first input signal and comprising at least one input electrode for applying a second electrical input thereto and an output electrode providing electrical output of the basic unit, thereby allowing to expose the Photocathode to the photon flux indicative of the first input signal, x(t), and to operate the input electrode with the second electrical input signal, V(t), thus causing the output signal, I(t), at said output electrode in the form of approximation of a product x(t)·V(t), the basic units being arranged such that all the Photocathodes are maintained at the same potential, the device having one of the following configurations: (i) the same input signal, x(t), is supplied to all the Photocathodes, and different functions of the input signal, V(t), are supplied to said input electrodes; and (ii) the same input voltage signal, V(t), is supplied to all the input electrodes, and different functions of the input signal, x(t), are used for illuminating different Photocathodes.

18. The device of claim 17, wherein the basic unit is configured as a triode structure with a Photocathode.

19. The device of claim 18, wherein said triode has a substantially linear configuration.

20. The device of claim 19, wherein said triode is configured to have a substantially linear I-V characteristic.

21. An analog real-time signal processing device configured to perform electrical signal processing, the device comprising an electronic circuit that includes an array of the basic units, each basic unit comprising at least one Photocathode for applying thereto an input photon flux indicative of a first input signal to cause electrons' emission in response to the first input signal and comprising at least one input electrode for applying a second electrical input thereto and an output electrode providing electrical output of the basic unit, thereby allowing to expose the Photocathode to the photon flux indicative of the first input signal, x(t), and to operate the input electrode with the second electrical input signal, V(t), thus causing the output signal, I(t), at said output electrode in the form of approximation of a product x(t)·V(t), the basic units being arranged such that all the Photocathodes are maintained at the same potential, the device being configured and operable to supply to all the Photocathodes the same input light signal, x(t), and supply different functions of the input voltage signal, V(t), to the different Gates, respectively, and being adapted to perform at least one of the following signal processing operations: transformation of one of the first and second input signals to a required linear space in accordance with a selected base function defining the other of the first and second input signals; determine correlation between the first and second input signals; identification of a certain signal component in one of the input signals by supplying said certain signal component as the other input signal.

22. The device of claim 21, wherein the electronic circuit comprises an integration circuitry.

23. An analog real-time signal processing device configured to perform electrical signal processing, the device comprising an electronic circuit including at least one basic unit, the basic unit comprising a triode with a Photocathode to cause electrons' emission in response to an input photon flux indicative of a first input signal and at least one Gate electrode for a second electrical input and one Anode for electrical output, and an insulating layer structure between the input Gate electrode and the Photocathode, the electrical output at the Anode being in the form of an approximation of a product of the input first and second signals.

24. The device of claim 23, wherein one of the input signals, x(t) and V(t), is the input signal to be processed, and the other input signal is a base function of a required transformation, the output signal at the Anode thereby presenting the required transformation of the input signal.

25. The device of claim 23, wherein one of the input signals, x(t) and V(t), is the input signal to be processed to identify therein a required signal component, and the other input signal is in the form of said required signal component to be identified.

26. The device of claim 23, wherein the insulating layer structure is in physical contact with the Gate.

27. The device of claim 26, wherein the insulating layer structure is in physical contact with the Photocathode.

28. An analog real-time signal processing device configured to perform electrical signal processing, the device comprising an electronic circuit including at least one basic unit, the basic unit comprising a triode having a substantially linear configuration and being formed by a Photocathode to cause electrons' emission in response to an input photon flux indicative of a first input signal, at least one Gate electrode for a second electrical input, and one Anode for electrical output, an insulating layer structure being provided between the input Gate electrode and the Photocathode.

29. The device of claim 28, wherein the insulating layer structure is in physical contact with the Gate.

30. The device of claim 29, wherein the insulating layer structure is in physical contact with the Photocathode.

31. An analog real-time signal processing device configured to perform electrical signal processing, the device comprising an electronic circuit comprising at least one basic unit, the basic unit comprising at least one Photocathode for applying thereto an input photon flux indicative of a first input signal to cause electrons' emission in response to the first input signal and comprising at least one input electrode for applying a second electrical input thereto and an output electrode providing electrical output of the basic unit, thereby allowing to expose the Photocathode to the photon flux indicative of the first input signal, x(t), and to operate the input electrode with the second electrical input signal, V(t), thus causing the output signal, I(t), at said output electrode in the form of approximation of a product x(t)·V(t), a distance between the Photocathode and the output Anode electrode substantially not exceeding 10 microns.

32. An analog real-time signal processing device configured to perform electrical signal processing, the device comprising an electronic circuit comprising at least one basic unit, the basic unit comprising at least one Photocathode for applying thereto an input photon flux indicative of a first input signal to cause electrons' emission in response to the first input signal and comprising at least one input electrode for applying a second electrical input thereto and an output electrode providing electrical output of the basic unit, thereby allowing to expose the Photocathode to the photon flux indicative of the first input signal, x(t), and to operate the input electrode with the second electrical input signal, V(t), thus causing the output signal, I(t), at said output electrode in the form of approximation of a product x(t)·V(t), a spectrum of the photon flux to the Photocathode being substantially of a work function of the Photocathode, thereby providing a narrow energy distribution of emitted electrons.

33. An analog real-time signal processing device configured to perform electrical signal processing, the device comprising an electronic circuit including at least one basic unit, the basic unit comprising a triode with a Photocathode to cause electrons' emission in response to an input photon flux indicative of a first input signal and at least one Gate electrode for a second electrical input and one Anode for electrical output, the electrical output at the Anode being in the form of an approximation of a product of the input first and second signals, a spectrum of the photon flux to the Photocathode being substantially of a work function of the Photocathode, thereby providing a narrow energy distribution of emitted electrons.

34. An analog real-time signal processing device for performing electrical signal processing, the device comprising an electronic circuit formed by an electrodes' arrangement including an array of basic units each including at least a Photocathode, an Anode and a Gate; the device being configured such that all the Photocathodes are maintained at the same potential, and each of the basic units is operable by two input signals including a photon flux indicative of the first input signal for extracting electrons from the Photocathode and a second input electrical signal supplied to the Gate, such that either one of the input signals is the same for all the basic units and the other input signal is different for different basic units, an output signal at each of the Anodes being therefore in the form of a product of the respective two input signals.

35. An analog real-time signal transformer device for performing electrical transformation, the device comprising an electronic circuit including an electrodes' arrangement formed by a predetermined number of basic units each including at least a Photocathode, an Anode and a Gate, thereby allowing for electrons' extraction from the Photocathode by a photon flux being a function of an input signal, x(t), that is to undergo certain transformation; an electrical signal generator for supplying to the Gate a certain base function, V(t), defining said transformation, the device being thereby operable to provide an output signal at the Anode electrode of the basic unit in the form of said transformation of the input signal.

36. An electronic device including a Cathode electrode, a Gate electrode, and an Anode electrode, which are arranged such that a distance I between the Cathode' surface by which it faces the Anode's plane and the Gate's surface by which it faces the Anode's plane is significantly smaller than a distance L between the facing surfaces of the Cathode and the Anode, an Anode current $I_a$ being a substantially linear function of a voltage applied to the Gate.

37. The device of claim 36, wherein said distance I is approximately equal to 0.05 L.

38. The device of claim 36, comprising a first additional electrode located closer to the Anode.

39. The device of claim 38, wherein the distance I is of about 0.01 L, and a distance d between the Anode's surface by which is faces the Cathode and a surface of said first additional electrode by which it faces the Cathode's plane is about 0.1 L.

40. The device of claim 38, wherein the Gate electrode is located substantially in the Cathode's plane surrounding the Cathode with a distance I' between the Gate and the Cathode.

41. The device of claim 40, wherein the distance I' is substantially about the distance I.

42. The device of claim 40, comprising a second additional electrode located in a plane between the Cathode and the Gate.

43. The device of claim 42, wherein a distance $I_1$ between the inward facing surfaces of the Cathode and the second additional electrode is substantially equal to a distance $I_1$ between the inward facing surfaces of the second additional electrode and the Gate, and substantially equal to a distance d between the Anode's surface by which is faces the Cathode and a surface of said first additional electrode by which it faces the Cathode's plane.

44. The device of claim 43, wherein each of said distances is of about 0.03 L.

* * * * *